United States Patent [19]

Chang et al.

[11] Patent Number: 4,745,449
[45] Date of Patent: May 17, 1988

[54] INTEGRATED ELECTRONICS SUITABLE FOR OPTICAL COMMUNICATIONS

[75] Inventors: Tao-Yuasn Chang, Lincroft; Richard E. Howard, Holmdel, both of N.J.

[73] Assignee: American Telephone and Telegraph Company, AT&T Bell Laboratories, Murray Hill, N.J.

[21] Appl. No.: 83,873

[22] Filed: Aug. 7, 1987

Related U.S. Application Data

[63] Continuation of Ser. No. 695,806, Jan. 28, 1985, abandoned.

[51] Int. Cl.[4] .................... H01L 29/78; H01L 27/02; H01L 29/34
[52] U.S. Cl. .................... 357/23.1; 357/30; 357/40; 357/41; 357/54
[58] Field of Search ............ 357/49, 41, 30, 61, 357/50, 54, 22, 23.1, 23.5

[56] References Cited

U.S. PATENT DOCUMENTS 4,042,945  6/1977  Lin et al. .................. 357/54
4,442,445  4/1984  Malik et al. ............... 357/22

OTHER PUBLICATIONS

Liao et al., An $In_{0.53}Ga_{0.47}As/Si_3N_4$ n-Channel Inversion Mode MISFET", IEEE Electron Device Letters, vol. EDL-2, No. 11, Nov. 1981, pp. 288–290.
Barnard et al., "Double Heterostructure $Ga_{0.47}In_{0.53}As$ MESFETs with Submicron Gates", IEEE Electron Device Letters, vol. EDL-1, No. 9, Sep. 1980, pp. 174–176.

Primary Examiner—James W. Davie
Assistant Examiner—Georgia Y. Epps
Attorney, Agent, or Firm—Bruce S. Schneider

[57] ABSTRACT

High gain MESFETs, integratable with a photodetector for optical communications, result from a specific gate structure. In particular, a dielectric region, such as an undoped indium aluminum arsenide region overlaid by a thin aluminum oxide region, is employed. This gate combination with, for example, an n-type indium gallium arsenide active channel yields transconductances as high as 130 mS/mm.

19 Claims, 1 Drawing Sheet

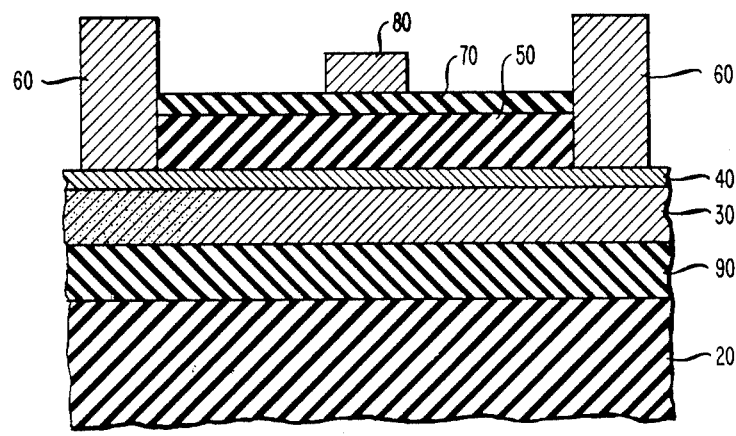

INTEGRATED ELECTRONICS SUITABLE FOR OPTICAL COMMUNICATIONS

This application is a continuation, of application Ser. No. 695,806, filed Jan. 28, 1985, now abandoned.

BACKGROUND OF THE INVENTION

1. Field of the Invention

This invention relates to semiconductor devices and, in particular, semiconductor devices suitable for optical communications systems.

2. Art Background

An optical communications system generally includes a source of electromagnetic radiation, a lightguide to transport this electromagnetic radiation, and a detector to detect the electromagnetic radiation as it exits the waveguide. Generally, the detector has been linked to semiconductor devices suitable for processing the detected information through conventional discrete conducting pathways, such as gold strips or wires. The use of these discrete conductors has several disadvantages, such as an associated capacitance which decreases response time. By combining the photodetector with at least a portion of its associated electronic circuitry on a single semiconductor substrate, this capacitance is eliminated. Thus, at present, there is a strong incentive to accomplish this integration.

To produce an integrated structure, the photodetector and the associated electronics are built on an insulating substrate. Fabrication is typically accomplished by sequentially depositing and configuring layers of various materials on the substrate. To prevent device degradation introduced by strain, any crystalline layer in the structure is lattice-matched to the underlying crystallized layer. Since most photodetectors presently contemplated are based on III-V semiconductor materials, the substrate and the associated electronics are conveniently based on similar materials to allow lattice-matching. For example, an iron-doped indium phosphide substrate is overlaid by a lattice-matched buffer region such as an indium aluminum arsenide buffer region. The buffer region is typically sufficiently thick, e.g., 0.1 $\mu$m to 1 $\mu$m, to eliminate any crystal defects associated with the underlying substrate surface. If the active layer for the overlying electronic devices is to have a different stoichiometry from that of the first buffer layer, then it has been empirically found that a second thin buffer layer with the same stoichiometry as that of the active layer, but with no intentional doping, enhances device properties. The field effect transistor (FET) circuitry and the photodetector are then fabricated by forming and configuring further overlying layers. For example, these layers are formed to produce the essential components of the FET, i.e., (1) a source electrically connected to (2) a drain by (3) an active channel, e.g., a region of n-type doped indium gallium arsenide, and (4) a gate structure that controls the electrical flow through the channel.

In this context, various FET gate configurations have been explored. In one approach, a field effect transistor with a junction gate (JFET) is employed and is fabricated by depositing a semiconductor material such as p-type doped indium gallium arsenide onto the active channel. Currently, this approach allows relatively expeditious fabrication and yields adequate device characteristics such as transconductances up to 100 mS/mm. (Transconductance is defined as the change in source-to-drain current measured in milliamperes effected by a 1-volt change in the gate voltage per millimeter width of active channel.)

However, it is always desirable, by increasing transconductance, to yield the possibility of enhanced speed and greater sensitivity. Other gate configurations have been pursued in an attempt to effect such enhanced characteristics. For example, an insulated gate formed by sequentially depositing onto the active channel a silicon nitride layer and a metal contact has been investigated. To preclude pinhole formation, the silicon nitride must be relatively thick, i.e., 20 nm to 50 nm. However, this thickness requires a higher applied gate voltage to control the electrical current in the channel and thus lowers the achievable device gain. Such a device is further plagued by drifting electrical output due to both electron traps and mobile ions in the insulating layer.

In a second approach, attempts have been made to form an enhanced Schottky barrier gate on the active channel by employing a thinner silicon oxide insulator (thickness of 5 nm to 15 nm). These attempts have produced undesirable gate leakage currents probably due to pinhole formation.

A third gate configuration that theoretically offers enhanced characteristics includes a semiconductor-based dielectric layer, i.e., a low conductivity semiconductor layer with an energy bandgap larger than that of the active channel, and attendant high Schottky barrier height, e.g., an undoped indium aluminum arsenide layer, and a metal contact. Despite theoretical predictions, these devices also suffer from high gate leakage current, e.g., leakage current greater than 6 amps/cm$^2$.

SUMMARY OF THE INVENTION

The applicants have found that by forming a semiconductor-based dielectric region on the active layer, and overlying this layer with a thin aluminum oxide region, excellent device characteristics are obtainable. For example, such devices have transconductances up to 130 mS/mm for a 2 $\mu$m long gate. In one embodiment, the alminum oxide region is formed by an in-situ process performed by molecular beam epitaxy (MBE). In this process, an active channel, a semiconductor-based dielectric region, e.g., an indium aluminum arsenide region, and an aluminum layer are sequentially deposited. The resulting aluminum layer is made sufficiently thin so that subsequent exposure to an oxidizing agent allows complete oxidation.

BRIEF DESCRIPTION OF THE DRAWING

The FIGURE is illustrative of a device configuration associated with the inventive integrated optical detector bodies.

DETAILED DESCRIPTION

The particular photodetector structure and the particular substrate regions supporting the FETs of the electronic processing circuitry are not critical. Exemplary photodetector structures have been described in *Electronics Letters*, 17, T. P. Lee et al (1981), pages 431–432, and in *IEEE Journal of Quantum Electronics*, QE-17, R. F. Leheny et al (1981), pages 227–231, and include photodetectors such as $In_{0.53}Ga_{0.47}As$ p-i-n photodiodes formed by successive layers of n-type doped, undoped, and p-type doped $In_{0.53}Ga_{0.47}As$. Exemplary substrates are described in *IEEE Electron Device Letters*, EDL-3, T. Y. Chang et al (1982), pages 56-58, and include, for example, a semi-insulating indium phosphide base region, e.g., 20 in the FIGURE, an epitaxial buffer region, 90, such as an indium aluminum arsenide region and, if desired, a second buffer region, 30, such as indium gallium aluminum arsenide region, The constraints on composition and thickness of these substrate materials are dictated by the composition to be employed in the active region. It is, however, desirable that the device be built on a substrate which is sufficiently thick to provide physical integrity for the photodetector and its associated circuitry. Additionally, it is desirable in optical communications systems utilizing electromagnetic radiation of wavelengths longer than 1 μm to utilize III-V based semiconductor materials such as $In_{0.53}Ga_{0.47}As$. To facilitate lattice-matching to these semiconductor materials, the substrate is also generally a semiinsulating III-V based material such as iron-doped indium phosphide. (Typically, lattice mismatches greater than 1 percent are unacceptable.) Thus, in one exemplary embodiment where an indium gallium arsenide p-type/intrinsic/n-type (p-i-n) photodetector and an n-type indium gallium arsenide FET active channel, 40, are desired, a semi-insulating indium phosphide substrate is employed together with an indium aluminum arsenide buffer region. The stoichiometry of the buffer region is chosen to lattice-match both the underlying indium phosphide and the overlying indium gallium arsenide whose stoichiometry has also been chosen to allow such lattice-matching. (See T. Y. Chang et al, supra, for a full discussion of substrates and barrier and buffer regions together with the appropriate thicknesses and conductivities for each.)

The composition of the semiconductor-based dielectric, i.e., a material with a dielectric constant greater than 5 and a conductance less than 0.01 Siemen/cm, should also be chosen so that it s possible to lattice-match it to the active channel. For example, undoped indium aluminum arsenide with a stoichiometry of $In_{0.52}Al_{0.48}As$ and an impurity level less than $5 \times 10^{15} cm^{-3}$ is employable as the dielectric material with an indium gallium arsenide active channel having a stoichiometry of $In_{0.53}Ga_{0.47}As$. Generally, the dielectric layer, 50, should have a thickness in the range 5 nm to 70 nm. Thicknesses greater than 150 nm unduly increase the voltage required for device control, and thus unduly decrease the gain. Regions less than 1 nm thick are typically not continuous and thus lead to catastrophic failure of the device.

An aluminum oxide region, 70, is formed on the semiconductor-based dielectric, 50, in a manner which produces an interface state density less than $5 \times 10^{11} cm^{-2}$. (The density of interface states is measured by admittance versus gate voltage method. See, for example, *Physics of Semiconductor Device*, by S. M. Sze, Second Edition, Wiley (1981).) Additionally, the method of forming the aluminum oxide overlying layer should be chosen so that the layer is continuous and so that there is not sufficient aluminum metal or other non-oxide aluminum materials to induce a violation of the previously discussed interface state criterion.

In one embodiment, the aluminum oxide region is formed by the in-situ deposition of aluminum onto the previously deposited dielectric layer combined with subsequent oxidation of this aluminum region. For example, an undoped indium aluminum arsenide buffer layer, an n-type indium gallium arsenide active channel, and an undoped indium aluminum arsenide dielectric layer, as described in *IEEE Electron Device Letters*, *EDL*-1, J. Barnard et al (1980), pages 174-176, and T. Y. chang et al, supra, respectively, are formed by molecular beam epitaxy. In the same environment, an aluminum layer having a thickness in the range 1.5 nm to 3 nm is deposited onto the dielectric layer. The thickness of this aluminum layer should be in the range 1 nm to 3 nm. Layers thinner than 1 nm are generally not continuous. Layers thicker than 3 nm preclude total oxidation and thus generally produce unacceptable interface state densities. The aluminum is then easily oxidized by procedures such as heating in air atmosphere or exposure to oxygen plasma in a vacuum system.

The aluminum oxide region is then overlaid by a locally deposited, highly conductive region, 80, i.e., a metal region such as an aluminum or tungsten region, that defines the gate area. (See *Gallium Arsenide Processing Techniques*, by R. E. Williams (1984), Artech House, for a full description of suitable configurations, dimensions, and compositions (e.g., aluminum) for this overlying conductive region, and see *Japanese Journal of Applied Physics*, 21, K. Matsumoto et al, page L445 (1982), specifically for a description of a tungsten conductive gate region.) Additionally, the source and drain (each denominated 60) with their associated contacts are produced by conventional techniques such as alloying of gold-germanium as extensively described in R. E. Williams' book, supra, and in *Electronics Letters*, 20, P. M. Capani et al (1984), pages 446-447.

The following example is illustrative of the invention.

EXAMPLE

An iron-doped indium phosphide semi-insulating substrate (carrier concentration of $10^9 cm^{-3}$) having its major surface in the (100) plane was cleaved into $1.0 \times 1.4$ cm samples. These samples were sequentially immersed in hot trichloroethylene, hot acetone, and methanol. The samples were then rinsed in 18 megohm deionized water and etched in a 3:3:14 by volume solution of $H_3PO_4$, and $H_2O_2$, and $H_2O$ for 4 minutes. After etching, the sample was rinsed in deionized water and then in methanol. The sample was again etched for 45 seconds in a 0.3 percent bromine-in-methanol solution, rinsed in methanol, and rinsed in deionized water. The sample was processed with the $H_3PO_4/H_2O_2/H_2O$, 0.3 percent bromine, and $H_3PO_4/H_2O_2/H_2O$ etchants with their associated rinses. The sample was blown dry with the microfiltered dry nitrogen.

The cleaned sample was soldered with pure indium onto a molybdenum sample block which in turn was mounted on a receptacle connected to the transfer rod of a molecular beam epitaxy (MBE) apparatus. The deposition chamber of this MBE apparatus had eight thermally heated effusion sources with liquid nitrogen shrouds for mutual isolation. One of the effusion sources had a graphite crucible with three small wells. Each small well contained approximately 0.2 ml of pure gallium, and a larger well contained approximately 0.6 ml of pure indium. The indium well was covered, and this cover had an orifice of cross-sectional area that was 10 percent of the total cross-sectional area of the three gallium wells combined. The other seven sources had pyrolytic boron nitride crucibles. Two of these crucibles contained pure arsenic; the others contained, respectively, pure indium, pure aluminum, pure silicon, pure germanium, and pure maganese. All of the ovens except the arsenic oven had an associated mechanical shutter.

With the transfer rod, the sample was sequentially introduced through a loading chamber ($10^{-3}$ Torr), an intermediate chamber ($10^{-6}$ Torr), and onto the sample manipulator of the deposition chamber ($10^{-9}$ Torr). The transfer rod was then withdrawn. The sample block was resistively heated to a temperature of 200 degrees C. for initial outgassing. The liquid nitrogen shrouds for the oven were cooled, and effusion ovens were heated to their operating temperature.

When the arsenic pressure reached $2.7 \times 10^{-6}$ Torr, all shutters were closed and the sample was rotated to the growth position and heated to 307 degrees C. To remove any surface oxide, the sample temperature was increased to 498 degrees C. for 1-2 minutes. This desorption process was monitored utilizing a reflection high-energy electron diffraction system (RHEED) which included an 8 kV electron beam positioned to impinge on the sample at a glancing angle and a phosphorus screen for observation of the resulting diffraction pattern. (The RHEED pattern exhibited streaking of the half-order lines.) The sample was oriented with its <011> axis approximately parallel to the electron beam, and the sample temperature was decreased to approximately 440 degrees C.

The arsenic pressure was reduced towards $1.6 \times 10^{-6}$ Torr. When the arsenic pressure approached $2 \times 10^{-6}$ Torr, the heater current was raised to yield an associated increase in the sample temperature to 498 degrees C. After 5 minutes, the indium and aluminum shutters were opened and were maintained for a period to yield an indium aluminum arsenide buffer layer with stoichiometry of $In_{0.52}Al_{0.48}As$ and thickness of 450 nm. The indium and aluminum shutters were then simultaneously closed, and the indium/gallium and the germanium shutters were simultaneously opened. The deposition process was continued for 6 minutes to yield an indium gallium arsenide layer with a stoichiometry of $In_{0.53}Ga_{0.47}As$ and thickness of 100 nm. The indium/gallium and germanium shutters were then simultaneously closed and the indium and aluminum shutters again opened for 5 minutes to produce an undoped indium aluminum arsenide layer having a stoichiometry of $In_{0.52}Al_{0.48}As$ and a thickness of 45 nm. Throughout the entire growth period, the arsenic pressure was maintained at approximately $1.6 \pm 0.4 \times 10^{-6}$ Torr. The appropriate temperatures of the effusion ovens to yield the desired stoichiometries were determined utilizing controlled samples. The typical oven temperatures were 975 degrees C. for indium/gallium, 741 degrees C. for indium, 1013 degrees C. for aluminum, and 780 degrees C. for germanium.

After growth of the last indium aluminum arsenide layer, the sample temperature was reduced to approximately 370 degrees C., and all the ovens except the aluminum oven returned to a standby temperature. After the arsenic pressure dropped to below $4 \times 10^{-8}$ Torr, the sample was heated until the RHEED pattern showed quarterorder lines. The sample heater was extinguished and when the temperature of the sample dropped below 10 degrees C., the aluminum shutter was opened. Aluminum deposition continued until a 2 nm thickness was deposited. The aluminum oven was then cooled to its standby condition and the sample removed from the apparatus. The sample was removed from the molybdenum block by heating on a hot plate.

The aluminum surface was cleaned by sequential immersion in acetone methanol and deionized water. The cleaned surface was coated with a 6 percent solution of 950,000 molecular weight poly(methylmethacrylate) (PMMA) and spun at 6000 rpm to yield a 700 nm thick layer of PMMA. The PMMA layer was then baked at 160 degrees C. in an air ambient for 60 minutes. The sample was inserted onto the sample holder of a thermal evaporation apparatus. A germanium source (germanium having a purity of 99.9999 percent) was heated to yield a deposition rate of 1 nm/second. The deposition was continued until 30 nm of germanium had been deposited onto the PMMA. A 100 nm thick layer of AZ-4040 photoresist was spun at 5000 rpm onto the germanium layer after the germanium layer had been treated with a hexamethyldisiloxane adhesion promoter. The sample was then baked in an air ambient at 70 degrees C. for 30 minutes.

The source and drain regions of the device, as shown schematically in the Figure, were patterned utilizing a contact mask aligner having a 310 nm light source with a light intensity at the mask surface of 14.5 mW/cm$^2$. Exposure continued for 0.25 minute, and the exposed photoresist surface was developed with 1:4 by volume mixture of AZ-400K (a proprietary developer of Shipley Company) and water. The sample was placed on the driven electrode of a parallel plate reactive ion etching apparatus. The germanium surface exposed by development of the photoresist was etched by introducing sulfur hexafluoride at 10 mTorr into the etching chamber. A plasma was struck in the sulfur hexafluoride using a 50-volt cathode voltage at an r.f. frequency of 13.56 MHz. After the exposed germanium had been removed, the sulfur hexafluoride was evacuated and oxygen at a pressure of 10 mTorr was substituted. A voltage of 150 volts at an r.f. frequency of 13.56 MHz was applied for 20 minutes to etch through the PMMA exposed upon removal of the germanium.

The exposed region of aluminum oxide was removed by immersing the sample in a 1:1 mixture of deionized water and Shipley Microposit MF-312 photoresist developer. Upon removal of the aluminum, the exposed region of indium aluminum arsenide was etched in a 38:1:1 solution of deionized water, phosphoric acid, and hydrogen peroxide to expose the doped indium gallium arsenide layer.

This exposed indium gallium arsenide layer was metallized by sequentially evaporating 5 nm of nickel followed by 40 nm of germanium, 110 nm of gold, 35 nm of nickel, and 30 nm of gold. The evaporation rate for each of these layers was, respectively, 0.1 nm/second, 1 nm/second, 1.5 nm/second, 0.1 nm/second, and 1.5 nm/second. The trilevel photoresist was then removed by immersion of the sample in acetone for 30 minutes. The sample was placed at 450 degrees C. for 30 seconds in a hydrogen ambient on a graphite strip heater. After sintering, a trilevel resist having approximately the same configuration and composition as previously described was reapplied to the aluminum surface of the sample. The gate region was optically defined with a contact mask aligner, as described above, and the various resist layers were developed as also described above. However, the oxygen plasma was continued for 5 minutes at 150 volts to ensure that all the exposed aluminum was oxidized to aluminum oxide. The sample was placed on the sample holder of an electron beam evaporation apparatus using a 15 mm in 99.999 percent. The electron beam, with an electron beam current of 50 milliamps, was accelerated through a voltage of 4 kV. These conditions produced a deposition rate of 1 nm/second and were continued until 200 nm of aluminum had been deposited. The sample was then immersed in acetone to remove the trilevel resist structure.

The field effect transistors (FETs) were isolated by first spin-coating (5000 rpm) the sample with 1 μm of AZ-4110 resist—a proprietary product of the Shipley Company. The resist was baked for 30 minutes in an air ambient at 90 degrees C. This resist was exposed using a contact mask aligner, as described above, with a mask that protected the active area of the device. The sample was immersed in a 38:1:1 solution of deionized water, phosphoric acid, and hydrogen peroxide to isolate the devices. (An etch to remove undesired regions of the aluminum layer was not necessary because the photoresist developer had achieved this result.) The resulting transistors had 2 μm gates and exhibited a pinch-off voltage of $-1.5$ volts. The transconductance of the device was measured using an HP-4145 parameter analyzer to be 130 mS/mm. The devices showed no looping behavior and had a gate leakage current of approximately 0.1 μamps.

What is claimed is:

1. A body comprising an active device and a substrate providing physical integrity to said device, wherein said active device comprises (1) an active channel providing electrical continuity between a source and drain, and (2) a gate structure which, upon application of a potential, is capable of substantially decreasing electrical current in said channel characterized in that said gate structure comprises (1) a first dielectric region comprising a low conductivity semiconductor material overlying and having a bandgap greater than said active channel, and (2) a second dielectric region comprising an aluminum oxide material overlying said first dielectric region.

2. The body of claim 1 wherein said active channel comprises a III-V based semiconductor material.

3. The body of claim 2 wherein said substrate comprises a III-V based semiconductor material.

4. The body of claim 2 wherein said active channel comprises indium gallium arsenide.

5. The body of claim 4 including a photodetector that electrically communicates with said active device.

6. The body of claim 5 wherein said photodetector is a p-i-n photodetector.

7. The body of claim 6 wherein said photodetector comprises a III-V semiconductor material.

8. The body of claim 2 including a photodetector.

9. The body of claim 8 wherein said photodetector comprises a III-V based p-i-n photodetector.

10. The body of claim 1 including a photodetector.

11. The body of claim 10 wherein said photodetector comprises a p-i-n photodetector.

12. The body of claim 11 wherein said photodetector comprises a III-V based semiconductor material.

13. The body of claim 1 wherein said active channel comprises indium gallium arsenide.

14. The body of claim 13 including an electrically conductive region overlying said second dielectric region.

15. The body of claim 14 wherein said electrically conductive region comprises a material chosen from the group consisting of aluminum and tungsten.

16. The body of claim 1 including an electrically conductive region overlying said second dielectric region.

17. The body of claim 16 wherein said electrically conductive region comprises a material chosen from the group consisting of aluminum and tungsten.

18. The body of claim 1 wherein said first dielectric material comprises indium aluminum arsenide.

19. The body of claim 18 wherein said active channel comprises indium gallium arsenide.

* * * * *